(12) United States Patent
Takagi

(10) Patent No.: US 11,373,876 B2
(45) Date of Patent: Jun. 28, 2022

(54) FILM FORMING METHOD AND FILM FORMING APPARATUS

(71) Applicant: TOKYO ELECTRON LIMITED, Tokyo (JP)

(72) Inventor: Satoshi Takagi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 271 days.

(21) Appl. No.: 16/514,989

(22) Filed: Jul. 17, 2019

(65) Prior Publication Data
US 2020/0035508 A1   Jan. 30, 2020

(30) Foreign Application Priority Data

Jul. 25, 2018 (JP) .............................. JP2018-139734

(51) Int. Cl.
| | |
|---|---|
| *H01L 21/311* | (2006.01) |
| *H01L 21/3213* | (2006.01) |
| *H01L 21/02* | (2006.01) |
| *C23C 16/02* | (2006.01) |
| *H01L 21/3205* | (2006.01) |
| *C23C 16/24* | (2006.01) |
| *H01L 21/285* | (2006.01) |
| *C23C 16/44* | (2006.01) |
| *H01L 21/3065* | (2006.01) |

(Continued)

(52) U.S. Cl.
CPC .... *H01L 21/31116* (2013.01); *C23C 16/0227* (2013.01); *C23C 16/0236* (2013.01); *C23C 16/24* (2013.01); *C23C 16/44* (2013.01); *H01L 21/02049* (2013.01); *H01L 21/0262* (2013.01); *H01L 21/02068* (2013.01); *H01L 21/02123* (2013.01); *H01L 21/02172* (2013.01); *H01L 21/02263* (2013.01); *H01L 21/2855* (2013.01); *H01L 21/3065* (2013.01); *H01L 21/324* (2013.01); *H01L 21/32055* (2013.01); *H01L 21/32137* (2013.01); *H01L 21/67017* (2013.01); *H01L 21/67098* (2013.01); *H01L 21/67248* (2013.01)

(58) Field of Classification Search
None
See application file for complete search history.

(56) References Cited

U.S. PATENT DOCUMENTS

| | | | | |
|---|---|---|---|---|
| 7,737,005 B2 * | 6/2010 | Tada | ................ | H01L 21/76814 438/477 |
| 10,014,212 B2 * | 7/2018 | Chen | ................ | H01L 21/76826 |

FOREIGN PATENT DOCUMENTS

| | | | | |
|---|---|---|---|---|
| JP | 5-102076 A | | 4/1993 | |
| JP | 2009088421 | * | 4/2009 | ............. C23C 16/02 |

(Continued)

*Primary Examiner* — Jiong-Ping Lu
(74) *Attorney, Agent, or Firm* — Nath, Goldberg & Meyer; Jerald L. Meyer; Tanya E. Harkins

(57) ABSTRACT

A film forming method includes: removing a natural oxide film formed on a front surface of a metal-containing film by supplying a hydrogen fluoride gas to a substrate accommodated in a processing container, the substrate having the metal-containing film formed thereon, and the metal-containing film including no metal oxide film; and forming a silicon film on the metal-containing film by supplying a silicon-containing gas into the processing container, wherein the step of forming the silicon film occurs after the step of removing the natural oxide film.

6 Claims, 6 Drawing Sheets

(51) Int. Cl.
*H01L 21/324* (2006.01)
*H01L 21/67* (2006.01)

(56) References Cited

FOREIGN PATENT DOCUMENTS

JP 2011-190499 A 9/2011
JP 2012-204691 A 10/2012

* cited by examiner

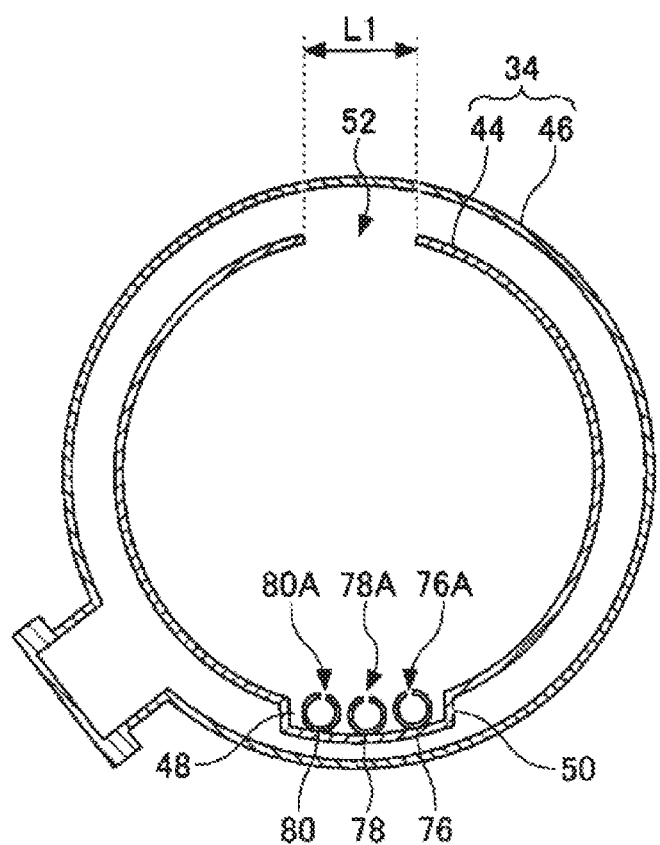

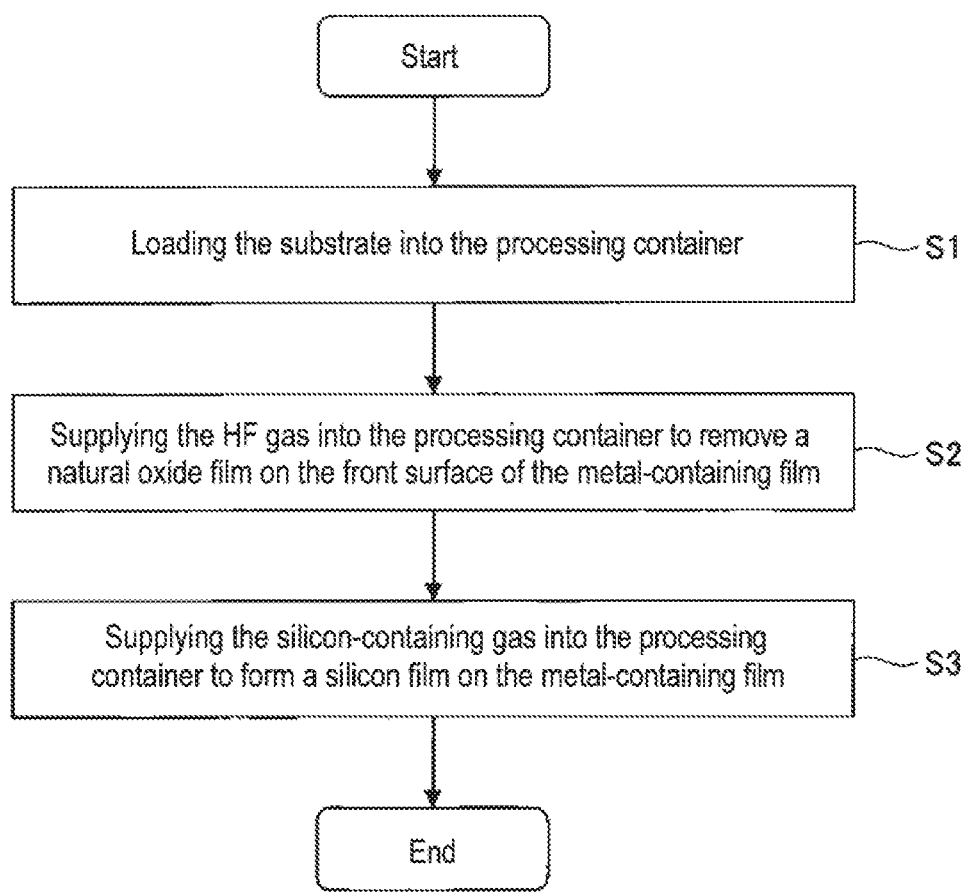

FILM FORMING METHOD AND FILM FORMING APPARATUS

CROSS-REFERENCE TO RELATED APPLICATION

This application is based upon and claims the benefit of priority from Japanese Patent Application No. 2018-139734, filed on Jul. 25, 2018, the entire contents of which are incorporated herein by reference.

TECHNICAL FIELD

The present disclosure relates to a film forming method and a film forming apparatus.

BACKGROUND

There is known a technique in which, in formation of a second metal film (Al film) on a first metal film (TiN film), a front surface of the first metal film is cleaned with an aqueous solution of HF to form a state in which the second metal film is easily adsorbed onto the first metal film (see, e.g., Patent Document 1).

RELATED ART DOCUMENT

Patent Documents

Patent Document 1: Japanese Patent Laid-Open Publication No. 2011-190499

SUMMARY

Some embodiments of the present disclosure provide a technique capable of forming a silicon film on a metal-containing film in a short period of time with good in-plane uniformity.

According to an embodiment of the present disclosure, there is provided a film forming method, including: removing a natural oxide film formed on a front surface of a metal-containing film by supplying a hydrogen fluoride gas to a substrate accommodated in a processing container, the substrate having the metal-containing film formed thereon, and the metal-containing film including no metal oxide film, and forming a silicon film on the metal-containing film by supplying a silicon-containing gas into the processing container, wherein the forming the silicon film occurs after the removing the natural oxide film.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is an explanatory view of a processing container of the film forming apparatus shown in FIG. I.

FIG. 3 is a flowchart showing an example of a film forming method.

DETAILED DESCRIPTION

Figure 1:
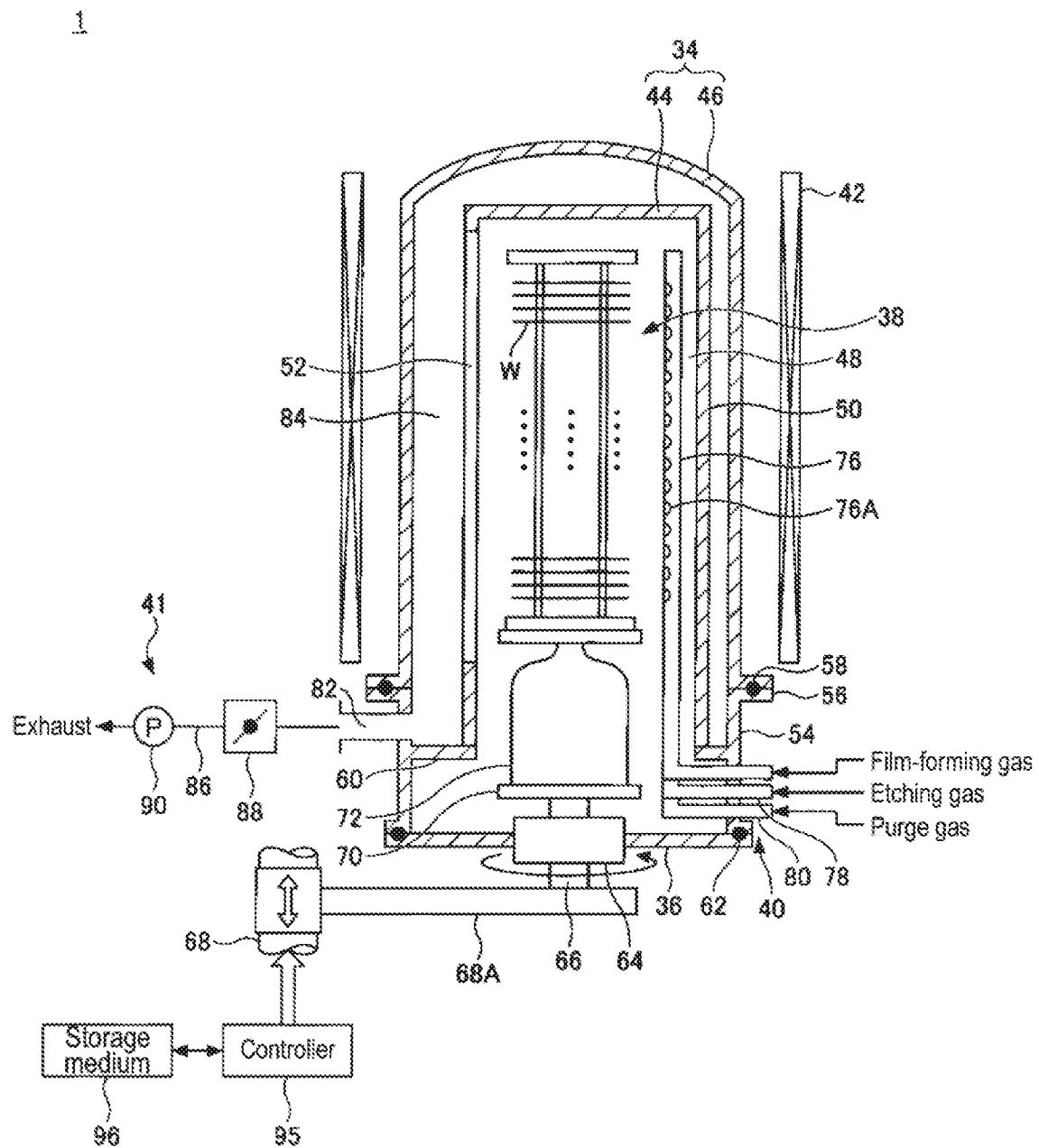
FIG. 1 is a schematic view showing an exemplary configuration of a film forming apparatus.

Hereinafter, non-limitative re exemplary embodiments of the present disclosure will now be described with reference to the accompanying drawings. In all the accompanying drawings, the same or corresponding members or components will be denoted by the same or corresponding reference numerals, and redundant explanations thereof will be omitted.

(Film Forming Apparatus)

A film forming apparatus that can implement a film forming method according to an embodiment of the present disclosure will be described by taking, as an example, a batch type vertical heat treatment apparatus for thermally processing a plurality of substrates in a collective manner. However, the film forming apparatus is not limited to the vertical heat treatment apparatus, and may be various other apparatuses. For example, the film forming apparatus may be a single-wafer apparatus that processes substrates one by one. Furthermore, the film forming apparatus may be, for example, a semi-batch type apparatus for forming a film on each of a plurality of substrates by allowing the plurality of substrates to sequentially pass through an area to which a raw material gas is supplied and an area to which a reaction gas that reacts with the raw material gas is supplied while revolving the plurality of substrates disposed on a rotary table inside a processing container by the rotary table.

FIG. 1 is a schematic view showing an exemplary configuration of the film forming apparatus. FIG. 2 is an explanatory view of a processing container of the film forming apparatus shown in FIG. 1.

As shown in FIG. 1, the film forming apparatus 1 includes a processing container 34 in which semiconductor wafers (hereinafter referred to as "wafers W") as substrates are accommodated.

The processing container 34 includes a cylindrical inner tube 44 having a ceiling, of which a lower end portion is opened, and a cylindrical outer tube 46 having a ceiling, of which a lower end portion is opened, to cover the inner tube 44. The inner tube 44 and the outer tube 46 are made of a heat resistant material such as quartz or the like, and are arranged in a coaxial relationship with each other to have a double-tube structure.

The ceiling of the inner tube 44 is, for example, flat. A nozzle accommodation portion 48 in which a gas supply pipe is accommodated is formed at one side of the inner tube 44 along a longitudinal direction (vertical direction). For example, as shown in FIG. 2, a portion of the sidewall of the inner tube 44 protrudes outward to form a protruded portion 50. The interior of the protruded portion 50 is formed as a nozzle accommodation portion 48. At the opposite sidewall of the inner tube 44, a rectangular opening 52 having a width L1 is formed along the longitudinal direction (vertical direction) so as to face the nozzle accommodation portion 48, The opening 52 is a gas exhaust port formed to exhaust a gas inside the inner pipe 44 therethrough. The opening 52 may be formed to extend in a vertical direction so that a vertical length of the opening 52 is the same as or longer than that of a wafer boat 38. That is to say, an upper end of the opening 52 extends to have a height equal to or larger than a height position corresponding to an upper end of the wafer boat 38. A lower end of the opening 52 extends to have a height equal to or smaller than a height position corresponding to a lower end of the wafer boat 38.

A lower end of the processing container 34 is supported by a cylindrical manifold 54 made of, for example, stainless steel. A flange portion 56 is formed at an upper end of the manifold 54. A lower end of the outer tube 46 is installed and supported on the flange portion 56. A seal member 58 such as an O-ring or the like is interposed between the flange portion 56 and the lower end of the outer tube 46 to keep the interior of the outer tube 46 airtight.

An annular support portion 60 is provided on an upper inner wall of the manifold 54. A lower end of the inner tube 44 is installed and supported on the support portion 60. A lid 36 is airtightly attached to on opening of a lower end portion of the manifold 54 via a seal member 62 such as an O-ring or the like so as to airtightly close an opening of a lower end portion of the processing container 34, i.e., the opening of the manifold 54. The lid 36 is made of, for example, stainless steel.

A rotary shaft 66 is provided so as to pass through the central portion of the lid 36 via a magnetic fluid seal portion 64. A lower portion of the rotary shaft 66 is rotatably supported by an arm 68A of an elevating means 68 which is a boat elevator.

A rotary plate 70 is provided at an upper end of the rotary shaft 66. A wafer boat 38 for holding the wafers W is mounted on the rotary plate 70 via a quartz-made heat insulating stand 72. Therefore, by moving the elevating means 68 up and down, the lid 36 and the wafer boat 38 are moved up and down as a unit. Thus, the wafer boat 38 can be inserted into and removed from the processing container 34. The wafer boat 38 is a substrate holder configured to hold a large number of wafers W at predetermined intervals.

A gas supply means 40 is provided in the manifold 54 to introduce gases such as a film-forming gas, an etching gas, a purge gas and the like into the inner tube 44. The gas supply means 40 includes a plurality of (for example, three) quartz-made gas supply pipes 76, 78 and 80. Each of the gas supply pipes 76, 78 and 80 is provided inside the inner tube 44 along the longitudinal direction thereof. A base end of each of the gas supply pipes 76, 78 and 80 is bent in an L-like shape and is supported by the manifold 54 while penetrating the manifold 54.

As shown in FIG. 2, the gas supply pipes 76, 78 and 80 are installed in a line along the circumferential direction inside the nozzle accommodation portion 48 of the inner tube 44. A plurality of gas holes 76A, 78A and 80A are formed in the respective gas supply pipes 76, 78 and 80 at predetermined intervals along the longitudinal direction thereof. The respective gases can be discharged horizontally from the respective gas holes 76A, 78A and 80A. The predetermined intervals may be set to be equal to gaps between the wafers W supported by the wafer boat 38. Furthermore, positions of the gas holes 76A, 78A and 80A in the height direction may be set so that each of the gas holes 76A, 78A and 80A is positioned in the middle between the wafers W adjacent to each other in the vertical direction. Thus, each of the gases can be efficiently introduced into the gaps between the wafers W. In one embodiment, the gas supply pipe 76 constitutes a film-forming gas supply part for supplying the film-forming gas, the gas supply pipe 78 constitutes an etching gas supply part for supplying the etching gas, and the gas supply pipe 80 constitutes a purge gas supply part for supplying the purge gas. The film-forming gas, the etching gas and the purge gas are supplied into the processing container 34 in a state where flow rates of the film-forming gas, the etching gas and the purge gas are controlled as needed.

A gas outlet 82 is formed in an upper sidewall of the manifold 54 above the support portion 60 so that the gas inside the inner tube 44 discharged from the opening 52 can be exhausted through the space 84 between the inner tube 44 and the outer tube 46. An exhaust means 41 is provided at the gas outlet 82. The exhaust means 41 includes an exhaust passage 86 connected to the gas outlet 82. A pressure regulation valve 88 and a vacuum pump 90 are sequentially provided in the exhaust passage 86 so as to evacuate the interior of the processing container 34.

A cylindrical heating means 42 is provided at an outer peripheral side of the outer tube 46 so as to cover the outer tube 46. The heating means 42 heats the wafers W accommodated in the processing container 34.

The operation of each part of the film forming apparatus 1 is controlled by a controller 95 such as, for example, a computer or the like. Furthermore, a program of a computer that performs the operation of each part of the film forming apparatus I is stored in a storage medium 96. The storage medium 96 may be, for example, a flexible disk, a compact disk, a hard disk, a flash memory, a DVD, or the like.

(Film Forming Method)

Figure 4A:
FIGS. 4A to 4C are cross-sectional process views showing an example of the film forming method.
Figure 4B:
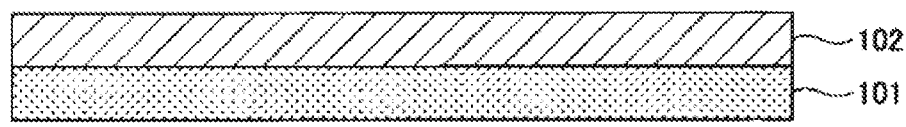
Figure 4C:
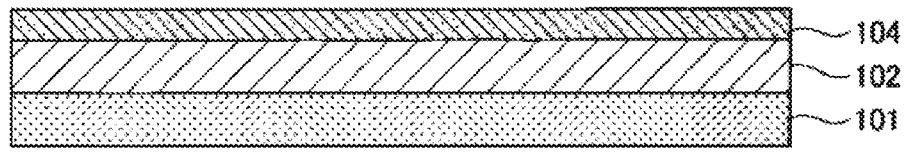

A film forming method according to an embodiment of the present disclosure will be described by taking, as an example, a case where an amorphous silicon film (hereinafter, simply referred to as a "silicon film") is formed on a metal-containing film formed on a substrate by the above-described film forming apparatus I. The following film forming method is executed by the controller 95 that controls the operation of each part of the film forming apparatus I. FIG. 3 is a flowchart showing an example of the film forming method. FIGS. 4A to 4C are process sectional views showing an example of the film forming method.

First, as shown in FIG. 4A, a substrate 101 having a metal-containing film 102 formed thereon is prepared. The substrate 101 may be, for example, a semiconductor wafer such as a silicon wafer or the like. The metal-containing film 102 is a film excluding a metal oxide film, and may be, for example, a metal film, a metal nitride film or a metal silicide film. Examples of the metal film may include a titanium film, a nickel film and a tungsten film. Examples of the metal nitride film may include a titanium nitride (TiN) film. Examples of the metal silicide film may include a nickel silicide film.

Subsequently, the substrates 101 are loaded into the processing container 34 heated to a predetermined temperature by the heating means 42 (in a loading step S1). In one embodiment, first, the wafer boat 38 holding a large number of substrates 101 is loaded into the processing container 34 heated to a predetermined temperature by the elevating means 68, and the opening of the lower end portion of the processing container 34 is airtightly closed and sealed by the lid 36. Subsequently, the interior of the processing container 34 is evacuated by the exhaust means 41 so that an internal pressure of the processing container 34 becomes a predetermined pressure. The predetermined temperature may be substantially equal to a temperature in a film forming step S3 described later and may be, for example, 300 degrees C. or more. The term "substantially equal" used herein encompasses a case where the predetermined temperature is evaluated to be strictly equal to the temperature in the film forming step S3 and a case where the predetermined temperature is evaluated to be substantially equal to the temperature in the film forming step S3. If the temperature when the substrates 101 are loaded into the processing container 34 is set substantially equal to the temperature in the film forming step S3, it is unnecessary to perform a step of raising the temperature to a film-forming temperature after loading the substrates 101. This makes it possible to shorten a processing time. If the substrates 101 are loaded into the processing container 34 at the temperature substantially equal to the temperature in the film forming step S3, as compared with a case where the substrates 101 are loaded into the processing container 34 at a low temperature such as room temperature or the like, it is highly likely that a front surface of the metal-containing film 102 is oxidized to form a metal oxide film 103 which is a natural oxide film. For example, as shown in FIG. 4A, the metal oxide film 103 may not be formed at the central portion of the substrate 101, but may be formed in a partial area of the front surface of the metal-containing film 102, such as a peripheral edge portion of the substrate 101 or the like.

Subsequently, a hydrogen fluoride (HF) gas as an etching gas is supplied from the gas supply pipe 78 into the processing container 34 kept at the predetermined temperature, thereby removing the metal oxide film 103 on the front surface of the metal-containing film 102 as shown in FIG. 4B (in a removal step S2). In one embodiment, the removal step S2 is performed while rotating the wafer boat 38. In the removal step S2, a fluorine gas is not used because not only the metal oxide film 103 but also the metal-containing film 102 may be etched. Furthermore, in the removal step S2, plasma of a hydrogen fluoride gas is not generated because the metal-containing film 102 may be etched.

Figure 5:
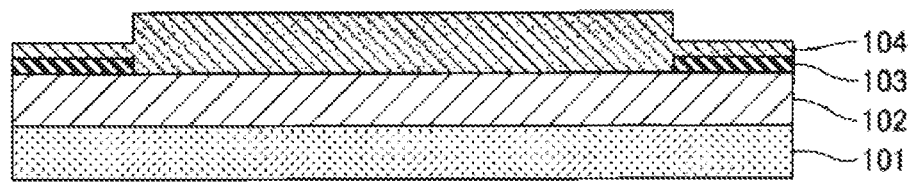
FIG. 5 is a view for explaining in-plane uniformity in Film thickness of a silicon film.

Subsequently, a silicon-containing gas is supplied from the gas supply pipe 76 into the processing container 34 kept at the predetermined temperature, thereby forming a silicon film 104 on the metal-containing film 102 as shown in FIG. 4C (in a film-forming step S3). In one embodiment, the film-forming step S3 is performed while rotating the wafer boat 38. At this time, an incubation time of the silicon film remains the same over the entire surface of the metal-containing film 102 because the t fetal oxide film 103 on the front surface of the metal-containing film 102 has been removed in the removal step S2. Therefore, a difference does not occur in a growth rate of the silicon film over the entire surface of the metal-containing film 102, which makes it possible to form the silicon film 104 with good in-plane uniformity. Examples of the silicon-containing gas may include a monosilane ($SiH_4$) gas or a disilane ($Si_2H_6$) gas. In the case where the metal oxide film 103 remains in a partial area of the front surface of the metal-containing film 102, a difference in the incubation time of the silicon film occurs between an area where the metal-containing film 102 is exposed and an area where the metal-containing film 102 are covered with the metal oxide film 103. Therefore, the growth rate of the silicon film 104 becomes uneven within the plane of the substrate 101. This deteriorates the in-plane uniformity in film thickness of the silicon film 104. For example, in the case where the metal oxide film 103 is not present at the central portion of the front surface of the metal-containing film 102 and is present at the peripheral edge portion of the front surface of the metal-containing film 102 as shown in FIG. 5, the film thickness of the silicon film 104 becomes thicker at the central portion and thinner at the peripheral edge portion. FIG. 5 is a view for explaining in-plane uniformity in film thickness of the silicon film.

(Actions and Effects)

Figure 6:
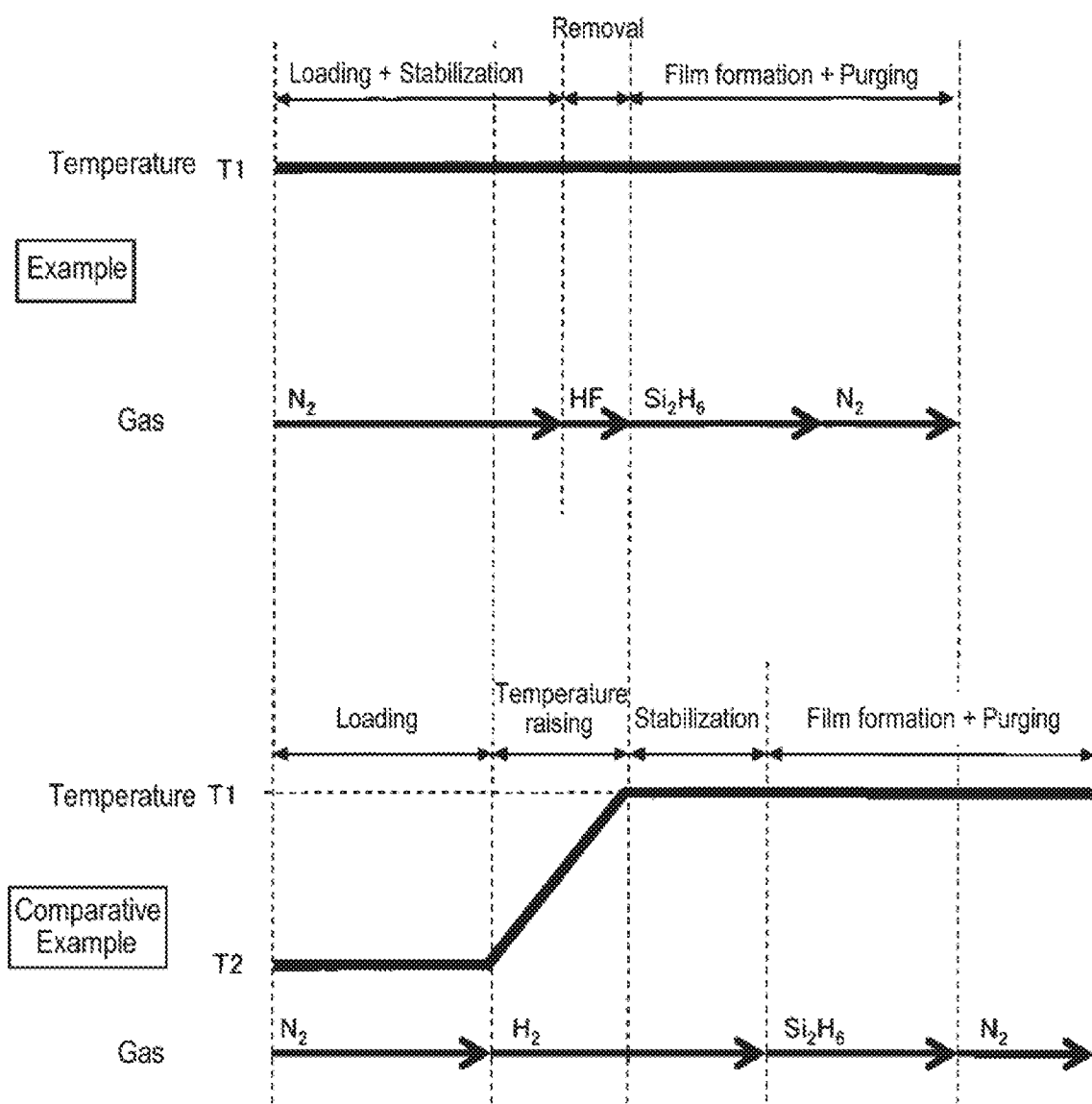
FIG. 6 is a view for explaining a processing time in a case of forming a silicon film on a metal-containing film.

The actions and effects exhibited by the film forming method according to an embodiment of the present disclosure will be described. FIG. 6 is a view for explaining a processing time in the case of forming the silicon film 104 on the metal-containing film 102. An upper stage in FIG. 6 shows a wafer temperature and a gas supply sequence in the case where the silicon film 104 is formed on the metal-containing film 102 by the film forming method according to the embodiment described above (Example). A lower stage in FIG. 6 shows a wafer temperature and a gas supply sequence in the case where the silicon film 104 is formed on the metal-containing film 102 by a conventional film forming method (Comparative Example).

In the Example, first, the substrate 101 is loaded into the processing container 34 heated to a first temperature T1 while supplying a nitrogen ($N_2$) gas as a purge gas into the processing container 34. The first temperature T1 is a temperature at which the silicon film 104 is formed. Subsequently, the interior of the processing container 34 is sealed, and the internal temperature of the processing container 34 is stabilized. Then, while keeping the interior of the processing container 34 at the first temperature T1, a hydrogen fluoride (HF) gas as an etching gas is supplied into the processing container 34 to remove the metal oxide film 103 on the front surface of the metal-containing film 102. A period of time during which the hydrogen fluoride gas is supplied may be, for example, 1 minute to 2 minutes. The removal of the metal oxide film 103 by the hydrogen fluoride gas may be performed simultaneously with the stabilization of the internal temperature of the processing container 34. Subsequently, while keeping the interior of the processing container 34 at the first temperature T1, the silicon film 104 is formed on the metal-containing film 102 by supplying a disilane ($Si_2H_6$) gas as a film-forming gas into the processing container 34. Thereafter, the nitrogen ($N_2$) gas as a purge gas is supplied into the processing container 34 to replace the disilane gas in the processing container 34 with the nitrogen gas.

On the other hand, in the Comparative Example, in order to suppress the formation of the metal oxide film 103 on the front surface of the metal-containing film 102, the wafer W is first loaded into the processing container 34 having a second temperature T2 lower than the first temperature T1 while supplying the nitrogen ($N_2$) gas as a purge gas into the processing container 34. Subsequently, while supplying a hydrogen ($H_2$) gas into the processing container 34 in a state which the interior of the processing container 34 is sealed, the internal temperature of the processing container 34 is increased from the second temperature T2 to the first temperature T1 so that the internal temperature of the processing container 34 is stabilized. Thereafter, as in the Example, while keeping the interior of the processing container 34 at the second temperature T2, the disilane ($Si_2H_6$) gas as a film-forming gas is supplied into the processing container 34 to form the silicon film 104 on the metal-containing film 102. Thereafter, the nitrogen ($N_2$) gas as a purge gas is supplied into the processing container 34 to replace the disilane gas in the processing container 34 with the nitrogen gas.

When the first temperature T1 is 400 degrees C. and the second temperature T2 is 300 degrees C., a period of time required for the loading of the substrate, the stabilization of the internal temperature and the removal of the metal oxide film 103 in the Example falls within a range of, for example, 50 to 70 minutes. On the other hand, a period of time required for the loading of the substrate, the raising of the internal temperature and the stabilization of the internal temperature in the Comparative Example falls within a range of, for example, 80 to 100 minutes. In addition, a period of time required for the loading of the substrate, the formation of the film and the purging is the same in the Example and the Comparative Example. Therefore, in the Example, the processing time during which the silicon film 104 is formed on the metal-containing film 102 can be reduced by 30 minutes to 50 minutes as compared with the Comparative Example.

Subsequently, an etched amount and resistivity of a titanium nitride film were measured when the hydrogen fluoride gas is supplied for 10 minutes in a state in which the wafer W having a titanium nitride film as an example of the metal-containing film 102 formed thereon is heated to 50 degrees C., 200 degrees C., 300 degrees C. and 400 degrees C., respectively.

Figure 7:
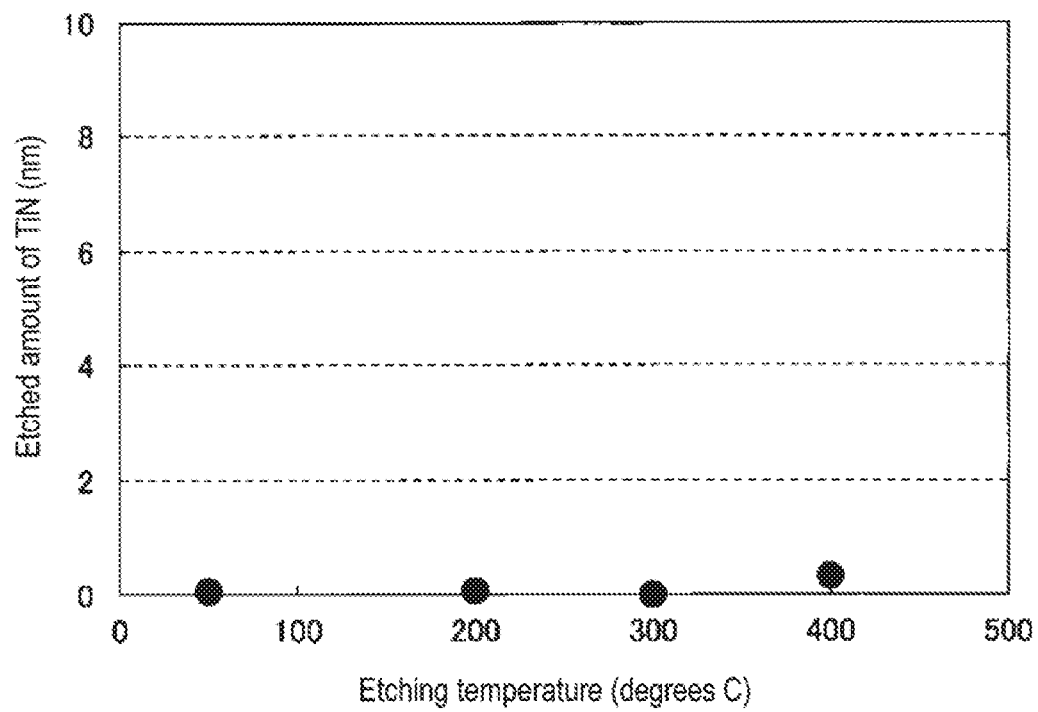
FIG. 7 is a view showing a relationship between an etching temperature and an etched amount of a TiN film.

FIG. 7 is a view showing a relationship between an etching temperature and the etched amount of the titanium nitride film. In FIG. 7, the horizontal axis indicates the etching temperature (degrees C.), and the vertical axis indicates the etched amount (nm) of the titanium nitride film.

As shown in FIG. 7, it can be seen that the titanium nitride film is not etched even when the temperature of the wafer W is any of 50 degrees C., 200 degrees C., 300 degrees C. and 400 degrees C. From this, it is thought that the metal oxide film 103 can be selectively etched without etching the metal-containing film 102 by controlling the temperature of the wafer W in the range of 50 degrees C. to 400 degrees C. using the hydrogen fluoride gas in the removal step S2.

Figure 8:
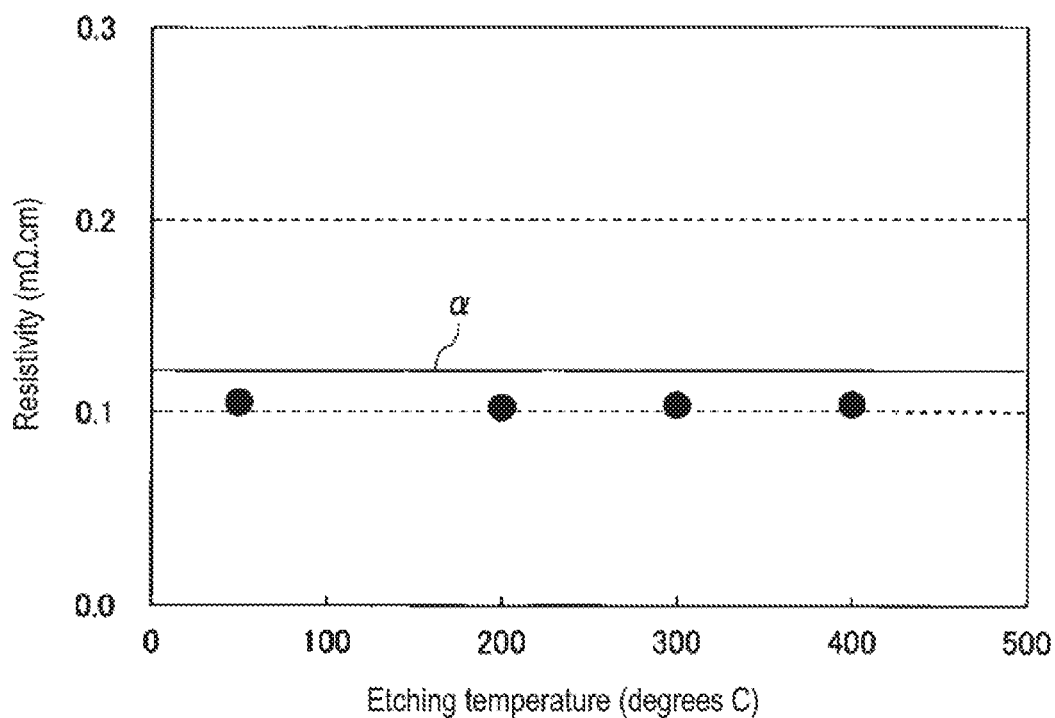
FIG. 8 is a view showing a relationship between an etching temperature and a resistivity of a TiN film.

FIG. 8 is a view showing the relationship between the etching temperature and the resistivity of the titanium nitride film. In FIG. 8, the horizontal axis indicates the etching temperature (degrees C.), the vertical axis indicates the resistivity (mΩ.cm) of the titanium nitride film, and the straight line a indicates the resistivity of the titanium nitride film before supplying the hydrogen fluoride gas.

As shown in FIG. 8, it can be seen that when the temperature of the wafer W is set to 50 degrees C., 200 degrees C., 300 degrees C. and 400 degrees C., the resistivity of the titanium nitride film is smaller than that of the titanium nitride film available before the supply of the hydrogen fluoride gas. Presumably, this is because the natural oxide film formed on the front surface of the titanium nitride film is removed by reacting with the hydrogen fluoride gas. From this, it is thought that the metal oxide film 103 formed on the front surface of the metal-containing film 102 can be removed by controlling the temperature of the wafer W in the range of 50 degrees C. to 400 degrees C. using the hydrogen fluoride gas in the removal step S2.

As described above, in the film forming method according to one embodiment, the metal oxide film 103 on the front surface of the metal-containing film 102 is removed in the same processing container 34 immediately before the silicon film 104 is formed. As a result, even if a natural oxide film is generated at the time of loading the wafer W, it is possible to remove the natural oxide film before the silicon film 104 is formed. Therefore, the temperature at the time of loading the wafer W into the processing container 34 can be made substantially equal to the temperature (e.g., 300 degrees C. or more) at which the silicon film 104 is formed. As a result, it is not necessary to raise the temperature after the wafer W is loaded into the processing container 34. Therefore, it is possible to omit the period of time required for raising the temperature and to shorten the processing time required for forming the silicon film 104 on the metal-containing film 102 formed on the wafer W.

In addition, the silicon film 104 can be formed on the metal-containing film 102 on which the metal oxide film 103 is not formed. Therefore, a difference in the growth rate of the silicon film 104 is less likely to occur in the plane of the wafer W. As a result, it is possible to improve the in-plane uniformity of the silicon film 104.

It should be understood that the embodiments disclosed herein are exemplary in all respects and are not restrictive. The embodiments described above may be omitted, substituted or changed in various forms without departing from the scope of the appended claims and the spirit thereof In the above-described embodiments, the case where the substrate is a wafer has been described by way of example. However, the present disclosure is not limited thereto. For example, the substrate may be a large substrate for a flat panel display (FM), or a substrate for an EL element or a solar cell.

According to the present disclosure in some embodiments, it is possible to form a silicon film on a metal-containing film in a short period of time With good in-plane uniformity.

What is claimed is:

1. A film forming method, comprising:
   removing a natural oxide film formed on a front surface of a metal-containing film by supplying a hydrogen fluoride gas to a substrate accommodated in a processing container, the substrate having the metal-containing film formed thereon, and the metal-containing film including no metal oxide film; and
   forming a silicon-containing film on the metal-containing film by supplying a silicon-containing gas into the processing container,
   wherein the forming the silicon-containing film occurs after the removing the natural oxide film, and
   wherein the removing the natural oxide film and the forming the silicon-containing film are performed at substantially the same temperature.

2. The method of claim 1, wherein the removing the natural oxide film is performed at a temperature of 300 degrees C. or more.

3. The method of claim 1, further comprising:
   loading the substrate into the processing container, before the removing the natural oxide film,
   wherein the loading the substrate and the forming the silicon-containing film are performed at substantially the same temperature.

4. The method of claim 1, wherein a plasma of the hydrogen fluoride gas is not generated in the removing the natural oxide film.

5. The method of claim 1, wherein the metal-containing film is a titanium nitride film.

6. The method of claim 1, wherein the silicon-containing gas is a disilane gas.

* * * * *